US008487602B2

(12) United States Patent
Lee

(10) Patent No.: US 8,487,602 B2
(45) Date of Patent: Jul. 16, 2013

(54) SWITCH DRIVING CIRCUIT AND DRIVING METHOD THEREOF

(75) Inventor: Young Sik Lee, Seoul (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 413 days.

(21) Appl. No.: 12/874,415

(22) Filed: Sep. 2, 2010

(65) Prior Publication Data

US 2011/0080205 A1    Apr. 7, 2011

(30) Foreign Application Priority Data

Oct. 6, 2009 (KR) .......................... 10-2009-0094780

(51) Int. Cl.
*G05F 1/40* (2006.01)

(52) U.S. Cl.
USPC .......................................... 323/285; 323/271

(58) Field of Classification Search
USPC ......... 323/222, 223, 225, 268, 271, 282–285, 323/288; 363/50; 361/18, 90, 91.1, 91.2
See application file for complete search history.

(56) References Cited

U.S. PATENT DOCUMENTS

| 5,977,758 | A  | * | 11/1999 | Noguchi et al. | ............... | 323/283 |
| 6,917,187 | B2 | * | 7/2005  | Okubo et al.   | ................. | 323/275 |
| 7,095,639 | B2 |   | 8/2006  | Cho et al.     |                 |         |
| 7,646,188 | B2 | * | 1/2010  | Suzuki         | ........................ | 323/284 |
| 7,646,574 | B2 | * | 1/2010  | Imura          | ........................ | 361/93.1 |
| 7,855,537 | B2 | * | 12/2010 | Aizawa         | ........................ | 323/277 |
| 8,125,202 | B2 | * | 2/2012  | Feldtkeller et al. | ........... | 323/271 |

* cited by examiner

*Primary Examiner* — Matthew Nguyen
(74) *Attorney, Agent, or Firm* — Okamoto & Benedicto LLP

(57) ABSTRACT

The present invention relates to a switch driving circuit and a driving method thereof. The switch driving circuit according to the present invention is supplied with a first voltage and a second voltage, is driven by a voltage difference between the first and second voltages, controls a switching operation of a power switch according to a switch driving control signal, generates a sense voltage corresponding to the second voltage, compares a predetermined reference voltage with the sense voltage, and stops the switching operation of the power switch according to the comparison result.

22 Claims, 9 Drawing Sheets

SWITCH DRIVING CIRCUIT AND DRIVING METHOD THEREOF

CROSS-REFERENCE TO RELATED APPLICATION

This application claims priority to and the benefit of Korean Patent Application No. 10-2009-0094780 filed in the Korean Intellectual Property Office on Oct. 6, 2009, the entire contents of which are incorporated herein by reference.

BACKGROUND OF THE INVENTION (a) Field of the Invention

The present invention relates to a switch driving circuit and a driving method thereof, and particularly relates to a switch driving circuit that can prevent a malfunction due to a negative voltage generated therein and a driving method thereof.

(b) Description of the Related Art

FIG. 1 schematically shows a conventional switch driving circuit. Referring to FIG. 1, a switch driving circuit 10 is connected to both ends of a bootstrap capacitor C1 and is driven by a voltage charged therein. A bootstrap diode Db is connected between a power source Vcc and the bootstrap capacitor C1, and is turned on during a period during which a source voltage Vs is lower than a voltage of the power source Vcc so that the bootstrap capacitor C1 is charged. Hereinafter, a voltage at a first end of the bootstrap capacitor C1 is referred to as a bootstrap voltage Vb, and a voltage at a second end thereof is referred to as a source voltage Vs.

A first side of an inductor L is connected to a power switch Q, and a second end thereof is connected to a first side of a capacitor C2. A second end of the capacitor C2 is connected to a ground terminal. A diode D is connected between the power switch Q and ground.

A parasitic diode Dp shown in FIG. 1 is formed between a terminal of a bootstrap voltage Vb of the switch driving circuit 10 and ground, and a parasitic inductor Lp, typically generated between wires, is generated in wires between the power switch Q and the diode D. The power switch Q is turned on/off by the switch driving circuit 10.

However, when the power switch Q is turned off, a freewheeling current i flows in a direction (the arrow direction of FIG. 1) in which a current flowing to the inductor L through the power switch Q passes through the diode D and the inductor L. Then, the source voltage Vs becomes lower than a ground voltage. When the source voltage Vs is decreased, the bootstrap voltage Vb is also decreased along with the decrease of the source voltage Vs. In this case, when the parasitic inductor Lp exists inside a circuit wire, a voltage drop occurs at both ends of the parasitic inductor Lp due to the freewheeling current. Due to the voltage drop, the source voltage Vs is further decreased. The voltage drop that occurs at both ends of the parasitic inductor Lp is a value obtained by multiplying inductance of the parasitic inductor Lp by (di/dt). Then, the bootstrap voltage Vb becomes lower than the ground voltage so that the parasitic diode Dp of the switch driving circuit 10 is turned on. Hereinafter, this is referred to as an abnormal state. Due to the abnormal state, much more current flow to the bootstrap capacitor C1 and the bootstrap capacitor C1 is an overcharge so that element damage occurs due to an over-voltage.

Moreover, malfunction of the switch driving circuit 10 due to the turn-on of the parasitic diode Dp causes the latch-up of the power switch Q so that the power switch Q is continuously turned on regardless a switch driving control signal. Then, the entire power control system including the switch driving circuit 10 is damaged.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a switch driving circuit that can prevent element damage and malfunction, and a driving method thereof.

A switch driving circuit according to an exemplary embodiment of the present invention receives a power voltage and a switch driving control signal and controls a switching operation of a power switch, and includes a gate signal generator and a protection unit that control the switching operation of the power switch. The gate signal generator receives a first voltage and a second voltage, operates by a voltage difference between first and second voltages, and controls a switching operation of the power switch according to the switch driving control signal. The protection unit generates a sense voltage corresponding to the second voltage, compares a predetermined reference voltage with the sense voltage, and controls the gate signal generator to stop the switching operation of the power switch according to the comparison result. The switch driving circuit further includes a bootstrap capacitor having a first end connected to an output terminal of the power switch and a second end to which the power voltage is supplied. The second voltage is a voltage at a first end of the bootstrap capacitor and the first voltage is a voltage at a second end of the bootstrap capacitor When the power switch is turned off, the protection unit generates a sense voltage that is proportional to an absolute value of the second voltage, compares the reference voltage with the sense voltage, and stops the switching operation of the power switch when the sense voltage is higher than the reference voltage. When the power switch is turned off, the second voltage becomes a negative voltage, and thus the protection unit generates the sense voltage by amplifying a voltage that is proportional to a sense current flowing to the output terminal of the power switch from a ground, and the reference voltage is set according to a sense voltage corresponding to the second voltage when the second voltage becomes the negative voltage and thus the first voltage becomes a negative voltage.

The protection unit includes a detection diode having a cathode connected to the output terminal of the power switch, a detection resistor having a first end connected to an anode of the detection diode and a second end connected to ground, an amplifier generating a sense voltage by amplifying a voltage at both ends of the detection resistor, a comparator comparing the sense voltage and the reference voltage, and a one-shot trigger generating a protection pulse signal when the sense voltage is higher than the reference voltage. The switch driving circuit further includes: a schmidt trigger controlling a level of an output signal by comparing the switch driver control signal, a predetermined high-level reference voltage, and a low-level reference voltage; a pulse generator generating an ON pulse signal that turns on the power switch and an OFF pulse signal that turns off the power switch according to the output of the schmidt trigger, and generating the OFF pulse signal according to the protection pulse signal; and a level shifter generating a first switching control signal according to the ON pulse signal, and generating a second switching control signal according to the OFF pulse signal. The gate signal generator turns on the power switch according to the first switching control signal and turns off the power switch according to the second switching control signal.

The protection unit includes: a detection diode having a cathode connected to the output terminal of the power switch; a detection resistor having a first end connected to an anode of the detection diode and a second end connected to ground; an amplifier generating a sense voltage by amplifying a voltage at both ends of the detection resistor; a comparator comparing the sense voltage and the reference voltage; and a flip-flop generating a negative voltage protection signal when the sense voltage is higher than the reference voltage. The switch driving circuit further includes: a Schmidt trigger controlling a level of an output signal by comparing the switch driver control signal, a predetermined high-level reference voltage, and a low-level reference voltage; a pulse generator generating an ON pulse signal that turns on the power switch and an OFF pulse signal that turns off the power switch according to the output of the Schmidt trigger, and generating the OFF pulse signal according to the negative voltage protection signal; and a level shifter generating a first switching control signal according to the ON pulse signal and generating a second switching control signal according to the OFF pulse signal. The gate signal generator turns on the power switch according to the first switching control signal and turns off the power switch according to the second switching control signal. The protection unit further includes a one-shot trigger that generates a protection pulse signal that is generated by being synchronized with the negative voltage protection signal and transmits the protection pulse signal to the pulse generator, and the protection pulse signal includes a predetermined-level pulse during a period that can be recognized by the pulse generator.

The gate signal generator of the switch driving circuit includes: a UVLO generating a low voltage barred signal to stop the switching operation of the power switch when a voltage difference between the first and second voltages is lower than a predetermined threshold voltage, and generates the low voltage barred signal according to a driving control signal to stop the switching operation of the power switch when the sense voltage is higher than the reference voltage; and a first flip-flop turning of the power switch according to the low voltage barred signal. The protection unit includes: a detection diode including a cathode connected to an output terminal of the switch; a detection resistor including a first end connected to an anode of the detection diode and a second end connected to ground; an amplifier generating a sense voltage by amplifying a voltage at both ends of the detection resistor; a comparator comparing the sense voltage and the reference voltage; a second flip-flop generating the negative voltage protection signal when the sense voltage is higher than the reference voltage; a resistor including a first end connected to the second end of the bootstrap capacitor; and a switch including a first electrode connected to a second end of the resistor, a second electrode connected to the ground, and a gate electrode receiving the negative voltage protection signal. The driving control signal is a voltage of the first electrode of the switch.

The switch driving circuit further includes a power voltage transmitting unit that blocks the power voltage transmitted to the gate signal generator when the sense voltage is higher than the reference voltage. The protection unit includes: a detection diode including a cathode connected to the output terminal of the power switch; a detection resistor including a first end connected to the anode of the detection diode and a second end connected to ground; an amplifier generating a sense voltage by amplifying a voltage at both ends of the detection resistor; a comparator comparing the sense voltage and the reference voltage; and a flip-flop generating a negative voltage protection signal when the sense voltage is higher than the reference voltage. The power voltage transmitting unit includes a bootstrap switch transmitting the power voltage to the second end of the bootstrap capacitor and a bootstrap driver turning off the bootstrap switch according to the negative voltage protection signal.

The gate signal generator includes: an inverter that is enabled or disabled according to the comparison result of the protection unit, a first transistor that is turned on according to an output of the inverter, and a second transistor that is turned on according to the output of the inverter, having a first end connected to a first end of the first transistor, and being different from the first transistor in type. The gate signal is determined according to a voltage at the first end of the first transistor and a voltage at the first end of the second transistor A driving method according to another exemplary embodiment of the present invention is provided to a switch driving circuit receives a first voltage, a second voltage, and a switch driving control signal, operates by a voltage difference between the first and second voltages, and controls a switching operation of a power switch according to the switch driving control signal. In further detail, the driving method includes generating a sense voltage corresponding to the second voltage, comparing a predetermined reference voltage with the sense voltage, and stopping the switching operation of the power switch according to the comparison result. The generating the sense voltage generates the sense voltage with a value that is proportional to an absolute value of the second voltage when the power switch is in the turn-off state. The stopping the switching operation of the power switch includes stopping the switching operation when the sense voltage is higher than the reference voltage. The driving method further includes: generating an ON pulse signal turning on the power switch and an OFF pulse signal turning off the power switch according to the switch driver control signal; generating a first switching control signal according to the ON pulse signal; generating a second switching control signal according to the OFF pulse signal; turning on the power switch according to the first switching control signal; and turning off the power switch according to the second switching control signal. The stopping the switching operation of the power switch includes generating the OFF pulse signal when the sense voltage is higher than the reference voltage.

The driving method further includes a low voltage barred signal to stop the switching operation of the power switch when a voltage difference between the first and second voltages is lower than a predetermined threshold voltage. The stopping the switching operation of the power switch includes the low voltage barred signal when the sense voltage is higher than the reference voltage.

The stopping the switching operation of the power switch includes blocking supply of the first voltage to the switch driving circuit when the sense voltage is higher than the reference voltage.

As described above, the switch driving device and a driving method according to the present invention can prevent overcharge of a bootstrap and damage to elements and malfunction thereof.

DETAILED DESCRIPTION OF THE EMBODIMENTS

Figure 1:
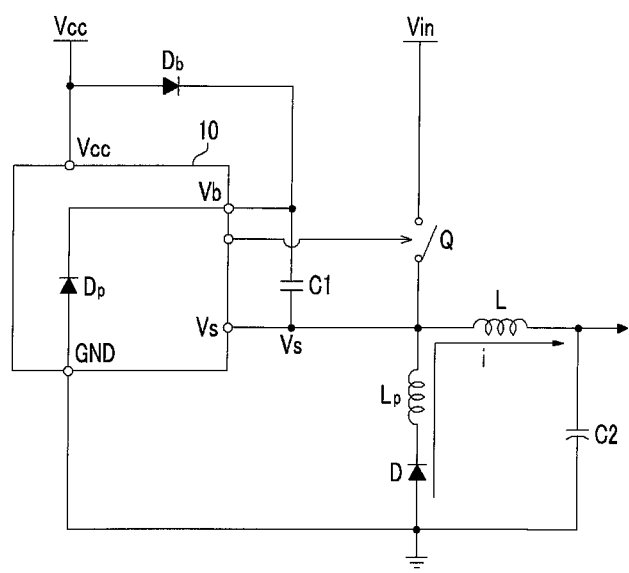
FIG. 1 schematically shows a conventional switch driving circuit.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

An exemplary embodiment of the present invention relates to a switch driving circuit that controls a switching operation of a power switch that controls power transmission. Particularly, the exemplary embodiment of the present invention protects a switch driving circuit in an abnormal state such as latch-up of the power switch. In further detail, a switch driving device according to the exemplary embodiment of the present invention turns off the power switch in the abnormal state.

The switch driving circuit according to the exemplary embodiment of the present invention changes a gate signal that controls the switching operation of the power switch to a level (hereinafter referred to as an off level) for turning off the power switch, or stops the switching operation of the power switch by stopping operation of a gate signal generator that generates the gate signal.

Figure 2:
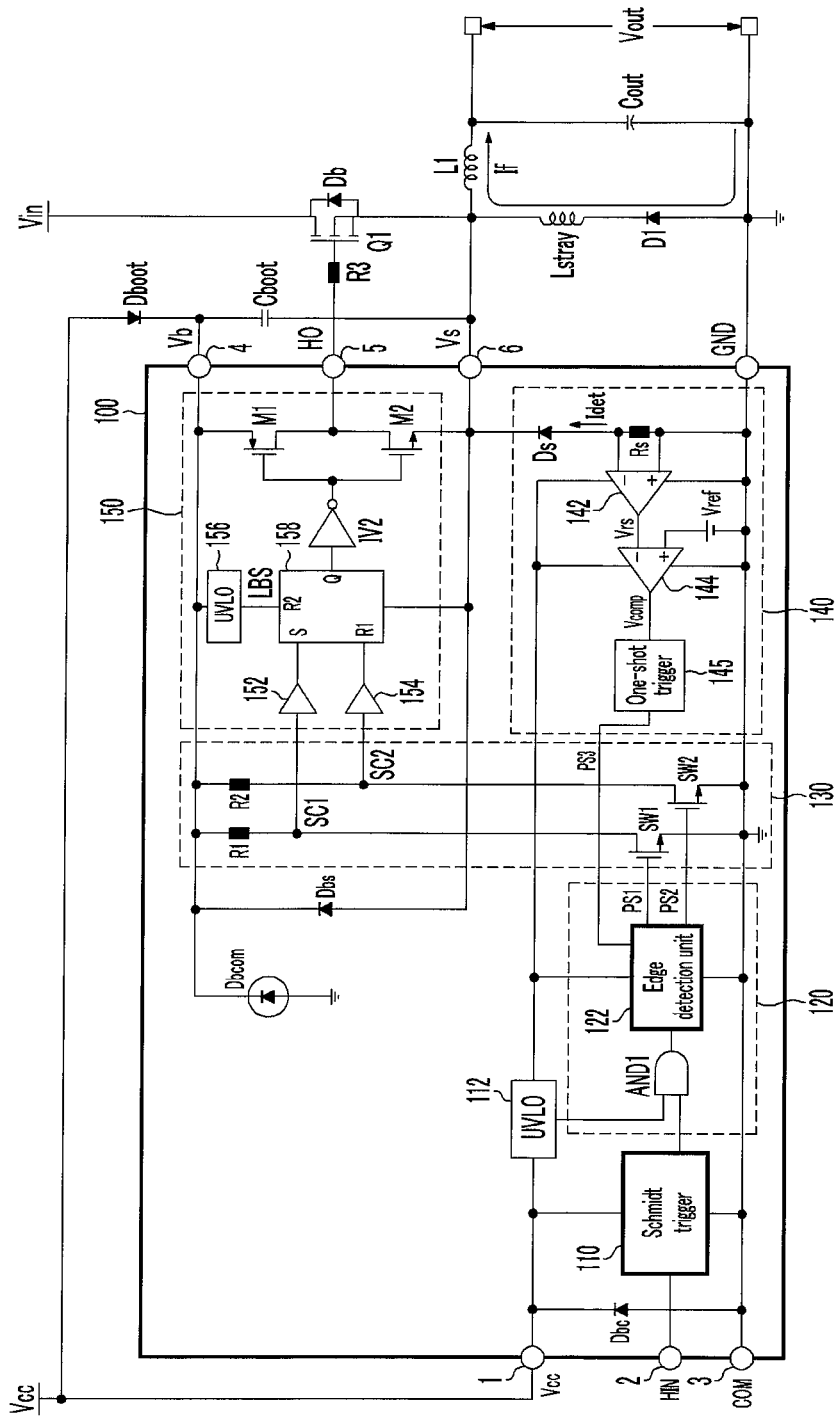
FIG. 2 shows a switch driving circuit according to a first exemplary embodiment of the present invention.

FIG. 2 shows a switch driving circuit according to a first exemplary embodiment of the present invention. A power switch Q1 of FIG. 2 is realized by using a metal-oxide-semiconductor field-effect transistor (MOSFET), or an insulated gate bipolar transistor (IGBT), and includes a body diode Db. The power switch Q1 according to the exemplary embodiment of the present invention is realized as an n-channel type MOSFET or IGBT element. Therefore, the power switch Q1 is turned on when a gate signal HO is high level, and is turned off when the gate signal HO is low level.

Referring to FIG. 2, the switch driving circuit 100 according to the first exemplary embodiment of the present invention includes a Schmidt trigger 110, an under voltage lock out (UVLO) 112, a pulse generator 120, a level shifter 130, a protection unit 140, and a gate signal generator 150. The switch driving circuit 100 is connected to a bootstrap capacitor Cboot through a connection terminal 4 and a connection terminal 6. A power voltage Vcc is input to an anode of the bootstrap diode Dboot, and a cathode of the bootstrap diode Dboot is connected to a first end of the bootstrap capacitor Cboot.

The connection terminal 4 of the switch driving circuit 100 is connected to the first end of the bootstrap capacitor Cboot and receives a bootstrap voltage Vb, and a connection terminal 6 is connected to a second end of the bootstrap capacitor Cboot. The switch driving circuit 100 receives the power voltage Vcc through a connection terminal 1, and receives a common voltage VCOM through a connection terminal 3. Here, the common voltage VCOM is a ground voltage level.

The power switch Q1 receives a predetermined input voltage Vin through a drain electrode, and a source electrode of the power switch Q1 is connected to the connection terminal 6 of the switch driving circuit 100. The source electrode of the power switch Q1 becomes an output terminal, and a voltage at the source electrode of the power switch Q1 becomes an output voltage Vout.

A first end of the resistor R3 is connected to the connection terminal 5 of the switch driving circuit 100, and a second end thereof is connected to a gate electrode of the power switch Q1. In addition, a cathode of the diode D1 is connected to the source electrode of the power switch Q1 and an anode thereof is connected to ground.

A first end of the inductor L1 is connected to the source electrode of the power switch Q1, and a second end thereof is connected to a first end of an output capacitor Cout. A second end of the output capacitor Cout is grounded. A both-end voltage of the output capacitor Cout becomes the output voltage Vout.

A parasitic inductor Lstray and parasitic diodes Dbs, Dbcom, and Dbc of FIG. 2 are generated between wires that connect the respective components of the switch driving circuit 100. In FIG. 2, the parasitic inductor Lstray and the parasitic diodes Dbs, Dbcom, and Dbc are shown as an equivalent circuit.

A first end of the parasitic inductor Lstray is connected to the source electrode of the power switch Q1, and a second end thereof is formed at the cathode of the diode D1. In FIG. 2, the parasitic inductor Lstray is disposed between the power switch Q1 and the diode D1 in consideration of the effect of the parasitic inductor Lstray to the inductor L1. However, the parasitic inductor Lstray may be disposed at other locations.

A cathode of the parasitic diode Dbs is connected to a terminal of the bootstrap voltage Vb, and an anode thereof is connected to a terminal of the source voltage Vs. A cathode of the parasitic diode Dbcom is connected to the terminal of the bootstrap voltage Vb, and an anode thereof is connected to the ground terminal. A cathode of the parasitic diode Dbc is connected to a terminal of the power voltage Vcc, and an anode thereof is connected to a terminal of the common voltage VCOM.

The Schmidt trigger 110 outputs a high-level signal when a switch driver control signal HIN is higher than a predetermined high-level reference voltage VIH, outputs a low-level signal when the switch driver control signal HIN is lower than a predetermined low-level reference voltage VIL, and maintains the present output signal level when the switch driver control signal HIN is between the high-level reference voltage VIH and the low-level reference voltage VIL.

The UVLO 112 receives the power voltage Vcc through the connection terminal 1, outputs a low-level signal when the power voltage Vcc is lower than a predetermined threshold voltage, and outputs a high-level signal when the power voltage Vcc is higher than the predetermined threshold voltage.

The pulse generator 120 includes an AND gate AND1 and an edge detection unit 122. The AND gate AND1 receives an output signal of the Schmidt trigger 110 and an output signal of the UVLO 112, performs an AND operation, and outputs a result of the AND operation to the edge detection unit 122.

The edge detection unit 122 generates an ON-pulse signal PS1 at a rising time when an output signal of the AND gate AND1 increases to high level from low level, and generates an OFF-pulse signal PS2 at a falling time at which the output signal AND gate AND1 decreases to the low level from the high level. The ON-pulse signal PS1 is synchronized at the rising time of the output signal of the AND gate AND1 and becomes a predetermined short pulse, and the OFF-pulse signal PS2 is synchronized at the falling time of the output signal of the AND gate AND1 and becomes a predetermined short pulse. In addition, the edge detection unit 122 is synchronized at a rising time of a protection pulse signal PS3 and generates the OFF-pulse signal PS2.

A level shifter 130 includes switches SW1 and SW2 and resistors R1 and R2. The switches SW1 and SW2 are respectively turned on/off according to the ON-pulse signal PS1 and the OFF-pulse signal PS2. The respective switches SW1 and SW2 are formed as n-type channel transistors. According to turn-on/off of the switches SW1 and SW2, switching control signals SC1 and SC2 are transmitted through driving units 152 and 154 through a set terminal S and a reset terminal R of the flip-flop 158. The switching control signal SC1 becomes a ground voltage when the switch SW1 is turned on, and the bootstrap voltage Vb becomes a division voltage according to a turn-off resistance ratio of the resistor R1 and the switch SW1 when the switch SW1 is turned off. The division voltage has a predetermined high level. The switching control signal SC2 becomes a ground voltage when the switch SW2 is turned on, and the bootstrap voltage Vb becomes a division voltage according to a turn-off resistance ratio of the resistor R2 and the switch SW2 when the switch SW2 is turned off. The division voltage has a predetermined high level.

The protection unit 140 controls the gate signal generator 150 to turn off the power switch Q1 when the source voltage Vs is decreased to the predetermined threshold voltage that causes an abnormal state. In further detail, the protection unit 140 generates a sense voltage Vrs corresponding to the source voltage Vs, and compares a predetermined reference voltage Vref with the sense voltage Vrs. The reference voltage Vref is set according to the sense voltage Vrs when the source voltage Vs is decreased to the threshold voltage and thus the bootstrap voltage Vb becomes a negative voltage under the abnormal state. When the sense voltage Vrs is higher than the reference voltage Vref, the protection unit 140 stops the switching operation of the power switch Q1. The protection unit 140 according to the first exemplary embodiment of the present invention generates a protection pulse signal PS3 to turn off the power switch Q1 when the sense voltage Vrs is higher than the reference voltage Vref.

In further detail, the protection unit 140 generates the sense voltage Vrs by amplifying a both-end voltage of a sense resistor Rs when a current (hereinafter referred to as a sense current) flowing from the ground to the terminal of the source voltage Vs flows to the sense resistor Rs. The sense current Idet flows when the source voltage Vs is decreased to a negative (−) voltage by the freewheeling current, and thus the detection diode Ds is turned on while the switch Q1 is in the turn-off state. That is, the sense voltage Vrs is proportional to an absolute value of the source voltage Vs. The protection unit 140 transmits a high-level protection pulse signal PS3 when the sense voltage Vrs is higher than the reference voltage Vref to the edge detection unit 122 for generation of the OFF-pulse signal PS2.

The protection unit 140 includes a detection diode Ds, a detection resistor Rs, an amplifier 142, a comparator 144, and a one-shot trigger 145.

A cathode of the detection diode Ds is connected to the connection terminal 6, and an anode thereof is connected to a first end of the detection resistor Rs. A second end of the detection resistor Rs is connected to ground. Since the detection diode Ds is turned on when the source voltage Vs is lower than the ground voltage, the amount of decrease of the source voltage Vs is detected by sensing the sense current Idet flowing to the detection resistor Rs when the detection diode Ds is turned on.

The amplifier 142 outputs a sense voltage Vrs by amplifying a both-end voltage of the detection resistor Rs. An inversion (−) terminal and a non-inversion (+) terminal of the amplifier 142 are respectively connected to the first and second ends of the detection resistor Rs, and an output terminal thereof is connected to an inversion (−) terminal of the comparator 144. The sense current Idet flows from the ground terminal in a direction of the detection resistor Rs and the detection diode Ds, and therefore a voltage input to the non-inversion (+) terminal of the amplifier 142 becomes higher than a voltage input to the inversion (−) terminal when the sense current Idet starts to flow. Since a voltage difference of the two terminals is increased as the sense current Idet is increased, the sense voltage Vrs is also increased.

The comparator 144 compares the sense voltage Vrs and the reference voltage Vref, and outputs a comparison voltage Vcomp according to the comparison result. The comparator 144 receives the sense voltage Vrs through the inversion (−) terminal and receives the reference voltage Vref through the non-inversion (+) terminal. The output terminal of the comparator 144 is connected to the set terminal S of the flip-flop 146. The comparator 144 transmits a high-level comparison voltage Vcomp to the one-shot trigger 145 when the sense voltage Vrs is lower than the reference voltage Vref. In addition, the comparator 144 transmits a low-level comparison voltage Vcomp to the set terminal S of the flip-flop 146 when the sense voltage Vrs is higher than the reference voltage Vref.

The one-shot trigger 145 is synchronized at a time when the sense voltage Vrs is higher than the reference voltage Vref, and generates the protection pulse signal PS3. The one-shot trigger 145 according to the first exemplary embodiment of the present invention is synchronized at a falling time of the comparison voltage Vcomp, and generates the protection pulse signal PS3 that is high-level during a predetermined time period. However, the present invention is not limited thereto.

The gate signal generator 150 includes driving units 152 and 154, a UVLO 156, a flip-flop 158, an inverter IV2, an ON-driving switch M1, and an OFF-driving switch M2. The driving unit 152 transmits a switching control signal SC1 to a set terminal S of the flip-flop 158, and the driving unit 154 transmits a switching control signal SC2 to a reset terminal R1 of the flip-flop 158.

The UVLO 156 outputs a low-level low voltage barred signal LBS when the both-end voltage of the bootstrap capacitor Cboot is lower than the predetermined threshold voltage, and outputs a high-level low voltage barred signal LBS when the both-end voltage of the bootstrap capacitor Cboot is higher than the predetermined threshold voltage. The low voltage barred signal LBS output from the UVLO 156 is input to a reset terminal R2 of the flip-flop 158.

The flip-flop 158 includes a set terminal S to which the switching control signal SC1 is input, a reset terminal R1 to which the switching control signal SC2 is input, and a reset terminal R2 to which the low voltage barred signal LBS is input. The flip-flop 158 according to the exemplary embodiment of the present invention turns on the power switch Q1 according to the switching control signal SC1, and turns off the power switch Q1 according to the switching control signal SC2 or the low voltage barred signal LBS. The flip-flop 158 is a NAND type flip-flop, but the present invention is not limited thereto.

When a low-level signal is input to the set terminal S of the flip-flop 158 and high-level signals are input to the reset terminals R1 and R2 of the flip-flop 158, the flip-flop 158 outputs a high-level output signal through the output terminal Q. The flip-flop 158 outputs a low-level output signal through the output terminal Q1 when a high-level signal is input to the set terminal S and low-level signals are input to the reset terminals R1 and R2. The flip-flop 158 maintains a current output when high-level signals are input to the set terminal R and the reset terminals R1 and R2. The inverter IV2 inverts the output signal of the flip-flop 158 and outputs the inverted signal. However, the flip-flop 158 according to the present invention is not limited thereto. The flip-flop 158 according to the present exemplary embodiment generates a signal to turn on the power switch Q1 according to the switching control signal SC1, and generates a signal to turn off the power switch Q1 according to the switching control signal SC2.

An ON driving switch M1 and an OFF driving switch M2 are respectively realized as a p-type channel transistor and an n-type channel transistor. The ON driving switch M1 receives the bootstrap voltage Vb through a source electrode, and the OFF driving switch M2 receives the source voltage Vs through the source electrode. The ON driving switch M1 and the OFF driving switch M2 receive an output signal of the inverter IV2 through a common gate electrode and output a gate signal HO through a common drain electrode. The ON driving switch M1 is turned on when the output signal of the inverter IV2 is low level, and outputs the gate signal HO with the bootstrap voltage Vb level. The OFF driving switch M2 is turned on when the output signal of the inverter IV2 is high level and outputs the gate signal HO with the source voltage Vs level.

Figure 3:
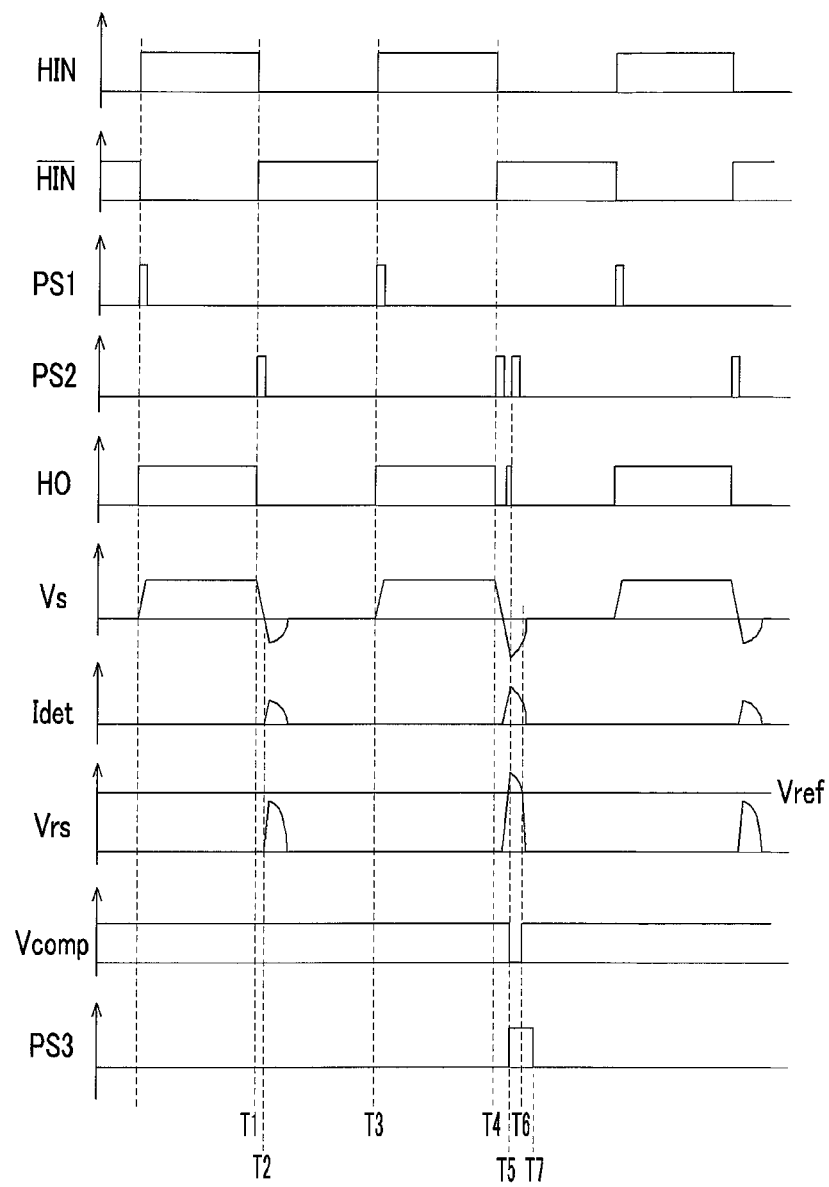
FIG. 3 is a waveform diagram of signals of the switch driving circuit according to the first exemplary embodiment of the present invention.

FIG. 3 shows a waveform diagram of signals of the switch driving circuit according to the first exemplary embodiment of the present invention.

Referring to FIG. 3, when the switching driving control signal HIN falls at a time T1, the Schmidt trigger 110 outputs a low-level signal, and the edge detection unit 122 generates the OFF-pulse signal PS2 at the time T1. Then, the gate signal HO becomes low level from high level, and the power switch Q1 is turned off.

Accordingly, the source voltage Vs is decreased to the ground voltage level after the time T1. In this case, a freewheeling current If flowing from the ground to the diode D1, the parasitic inductor Lstray, and the inductor L1 is generated.

After a time T2, the source voltage Vs becomes lower than the ground voltage and then decreases to a negative (−) voltage due to the freewheeling current If. When the source voltage Vs starts to decrease to the negative voltage, the detection diode Ds is turned on. Accordingly, the sense current Idet flows to the detection resistor Rs. The amplifier 142 generates the sense voltage Vrs by amplifying a voltage at both ends of the detection resistor Rs.

The comparator 144 compares the sense voltage Vrs with the reference voltage Vref. When the sense voltage Vrs is lower than the reference voltage Vref (hereinafter this state is referred to as a normal state), the comparator 144 maintains the comparison voltage Vcomp at high-level. Then, the one-shot trigger 145 maintains the protection pulse signal PS3 at low level.

When the switch driver control signal HIN increases to high level at a time T3, the AND gate AND1 outputs a high-level signal and the edge detection unit 122 generates the ON-pulse signal PS1. Then, the gate signal HO becomes high level from the low level so that the power switch Q1 is turned on. Then, the source voltage Vs is maintained at a constant level after being increased after the time T3.

When the power switch Q1 is turned off at a time T4, the source voltage Vs is decreased after the time T4. In this case, the source voltage Vs is decreased to a negative voltage so that an abnormal state is generated and the sense voltage Vrs may be higher than the reference voltage Vref at a time T5.

At the time T5, the comparator 144 generates a low-level comparison voltage Vcomp. The sense voltage Vrs is higher than the reference voltage Vref during the times T5 and T6 so that the comparison voltage Vcomp is low level during the times T5 and T6.

The one-shot trigger 145 is synchronized at a falling time of the comparison voltage Vcomp at the time T5, and generates a high-level protection pulse signal PS3. The protection pulse signal PS3 is maintained at high level during periods T5 to T7.

The edge detection unit 122 generates an OFF pulse signal PS2 at the time T5 according to the protection pulse signal PS3 to turn off the power switch Q1.

Under the abnormal state, the latch phenomenon may occur so that the power switch Q1 is turned on and maintains the turn-on state. The source voltage Vs is decreased and the bootstrap voltage Vb becomes a negative voltage under the abnormal state. Then, the power switch Q1 is not turned off by the bootstrap voltage Vb having the negative value and maintains the turn-on state due to the latch phenomenon. Further, the bootstrap capacitor Cboot may be over-charged.

For example, in FIG. 3, the power switch Q1 is turned off at the time T4 and then turned on at the time T5 due to the latch phenomenon.

In the present exemplary embodiment, the OFF pulse signal PS2 is generated in the time T5 so that the gate signal HO becomes low level and the power switch Q1 is turned off. Accordingly, the latch phenomenon can be suppressed.

The switch driving circuit according to the first exemplary embodiment of the present invention performs a protection operation for generating a gate signal to turn off the power switch Q1 under the abnormal state.

Figure 4:
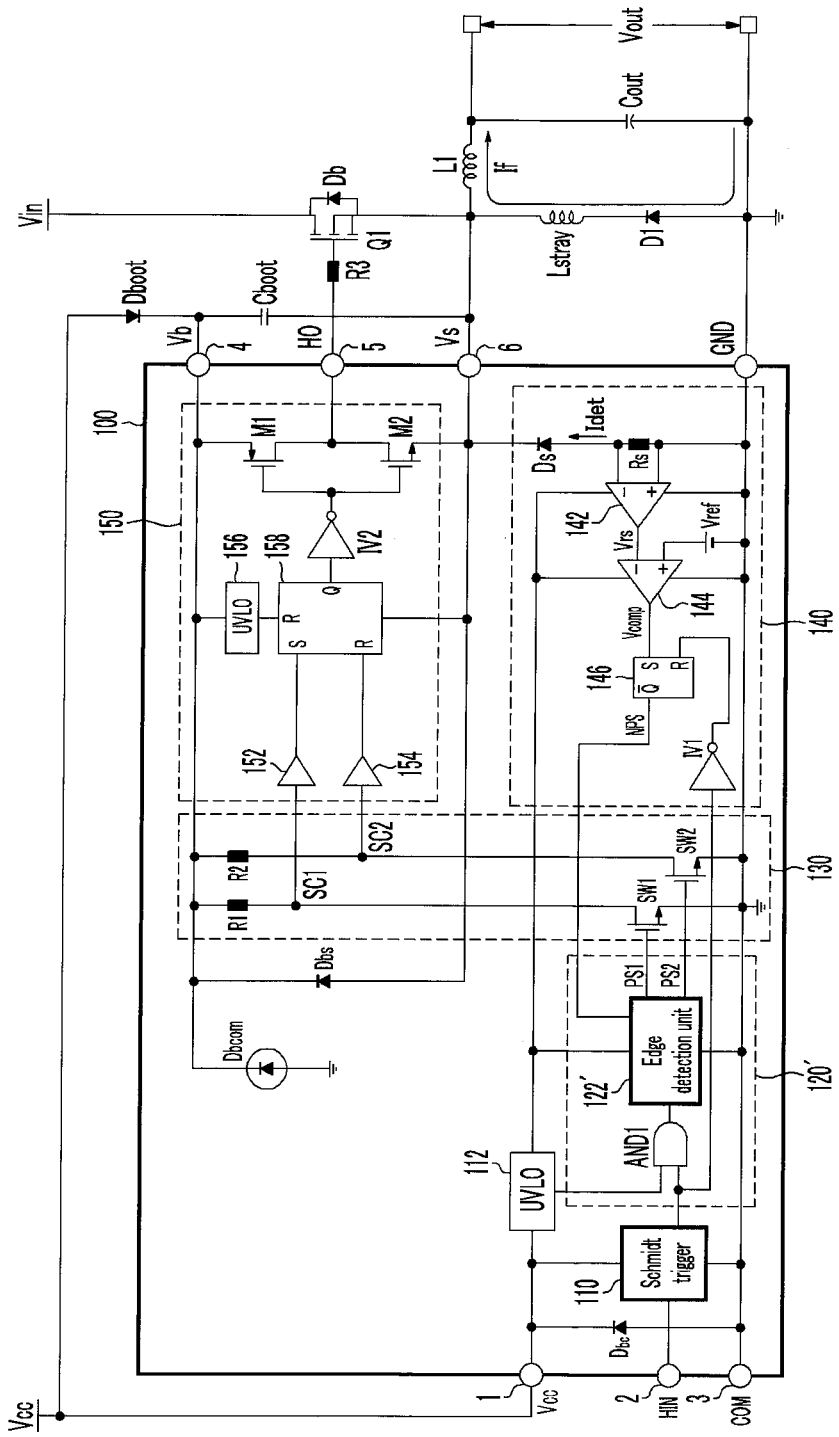
FIG. 4 shows a switch driving circuit according to a second exemplary embodiment of the present invention.

FIG. 4 shows a switch driving circuit 100' according to a second exemplary embodiment of the present invention. The second exemplary embodiment of the present invention is the same as the first exemplary embodiment except that a configuration of a protection unit 140' is different from that of the first exemplary embodiment and a negative voltage protection signal NPS is input to an edge detection unit 122' instead of the protection pulse signal PS3.

The negative voltage protection signal NPS is determined according to a comparison signal Vcomp, and controls a pulse generator 120' to turn off a power switch Q1 when a sense voltage Vrs is higher than a reference voltage Vref.

The edge detection unit 122' of the pulse generator 120' according to the second exemplary embodiment of the present invention generates an OFF-pulse signal PS2 according to the negative voltage protection signal NPS. In further detail, the edge detection unit 122' is synchronized at a rising time of the negative voltage protection signal NPS and generates a high-level OFF-pulse signal PS2. The edge detection unit 122' is synchronized at one of a falling time of an output signal of an AND gate AND1 or the rising time of the negative voltage protection signal NPS, and generates the high-level OFF-pulse signal PS2.

Compared to the protection unit 140 of the first exemplary embodiment, the protection unit 140' includes a flip-flop 46 generating the negative voltage protection signal NPS rather than including the one-shot trigger 145, and further includes an inverter IV1.

The protection unit 140' includes a detection diode Ds, a detection resistor Rs, an amplifier 142, a comparator 144, the flip-flop 146, and the inverter IV1.

A cathode of the detection diode Ds is connected to a connection terminal 6 and an anode thereof is connected to a first end of the detection resistor Rs. A second end of the detection resistor Rs is connected to the ground. Since the detection diode Ds is turned on when a source voltage Vs is lower than a ground voltage, the protection unit 140' senses a sense current Idet flowing to the detection resistor Rs when the detection diode Ds is turned on to detect the amount of decrease of the source voltage Vs.

The amplifier 142 outputs a sense voltage Vrs by amplifying a voltage at both ends of the detection resistor Rs. An inversion (−) terminal and a non-inversion (+) terminal of the amplifier 142 are respectively connected to the first and second ends of the detection resistor Rs, and an output terminal thereof is connected to an inversion (−) terminal of the comparator 144. The sense current Idet flows from the ground terminal in a direction of the detection resistor Rs and the detection diode Ds, and therefore a voltage input to the non-inversion (+) terminal of the amplifier 142 becomes higher than a voltage input to the inversion (−) terminal once the sense current Idet starts to flow. Since a voltage difference between the two terminals is increased as the sense current Idet is increased, the sense voltage Vrs is also increased.

The comparator 144 compares the sense voltage Vrs and the reference voltage Vref, and outputs a comparison voltage Vcomp according to the comparison result. The comparator 144 receives the sense voltage Vrs through the inversion (−) terminal and receives the reference voltage Vref through the non-inversion (+) terminal. An output terminal of the comparator 144 is connected to a set terminal S of the flip-flop 146. The comparator 144 transmits a high-level comparison voltage Vcomp to the set terminal S of the flip-flop 146 when the sense voltage Vrs is lower than the reference voltage Vref. In addition, the comparator 144 transmits a low-level comparison voltage Vcomp to the set terminal S of the flip-flop 146 when the sense voltage Vrs is higher than the reference voltage Vref.

The set terminal S of the flip-flop 146 receives the comparison voltage Vcomp and a reset terminal R thereof receives an output of the inverter IV1. The flip-flop 146 controls a pulse generator 12 to turn off the power switch Q1 according to the comparison voltage Vcomp. However, the present invention is not limited thereto. When the output of the inverter IV1 is high level, the flip-flop 146 outputs a high-level negative voltage protection signal NPA through an output terminal $\bar{Q}$ when the comparison voltage Vcomp is changed to low level from high level.

When the output of the inverter IV1 is high level, the flip-flop 146 outputs a low-level negative voltage protection signal NPS through the output terminal $\bar{Q}$ when the comparison voltage Vcomp is changed from low level to high level.

During a period in which an output signal of a Schmidt trigger 110 is low level, the power switch Q1 maintains a turn-off state. During this period, the output signal of the inverter IV1 is high level. When the power switch Q1 is in the turn-off state, the output of the flip-flop 146 is determined according to the comparison voltage Vcomp that is generated by the sense current Idet.

During a period in which the output signal of the Schmidt trigger 110 is high level, the power switch Q1 maintains a turn-on state. In this period, the output signal of the inverter IV1 is low level. Since the sense current Idet is not generated while the power switch Q1 is in the turn-on state, the comparison voltage Vcomp is high level. Therefore, a high-level signal is input to the set terminal S of the flip-flop 146 and a low-level signal is input to the reset terminal R of the flip-flop 146. Then, the flip-flop 146 outputs a low-level negative voltage protection signal NPS through the output terminal $\bar{Q}$.

Figure 5:
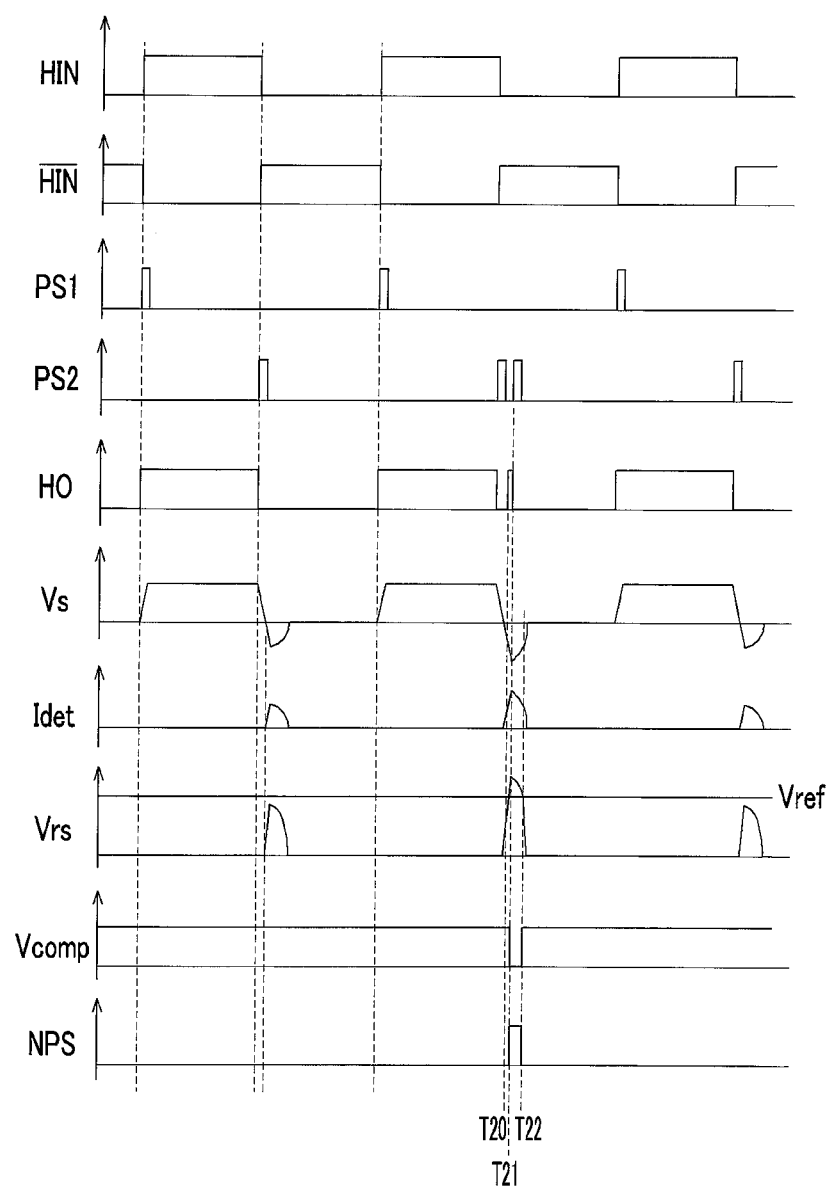
FIG. 5 is a waveform diagram of signals of the switch driving circuit according to the second exemplary embodiment of the present invention.

FIG. 5 is a waveform diagram of signals of a switch driving circuit according to the second exemplary embodiment of the present invention. As shown in FIG. 5, compared to the first exemplary embodiment, a negative voltage protection signal NPS is generated instead of the protection pulse signal PS3 in the second exemplary embodiment.

At a time T21, the negative voltage protection signal NPS is generated when the sense voltage Vrs is higher than the reference voltage Vref. Then, a high-level gate signal HO pulse generated at a time T20 disappears at the time T21. The negative voltage protection signal NPS is a pulse signal in high level during a period T21 and T22 in which the sense voltage Vrs is higher than the reference voltage Vref.

However, when a period from a time that the source voltage Vs starts to decrease to a negative voltage to a time that the source voltage Vs increases to a positive voltage is short, a period in which the sense voltage Vrs is higher than the reference voltage Vref is very short. Then, a low level period of the comparison voltage Vcomp is short and a high-level pulse of the negative voltage protection signal NPS is short.

When the high level period of the negative voltage protection signal NPS is short, the edge detection unit 122 may fail to sense a rising time of the negative voltage protection signal NPS. That is, the edge detection unit 122 may not be able to recognize a short high-level pulse of the negative voltage protection signal NPS.

In order to prevent this, a one-shot trigger 145' is synchronized at a rising time of a negative voltage protection signal NPS and generates a protection pulse signal PS3' having a high level pulse during a predetermined time period in which an edge detection unit 133 can sufficiently sense according to a third exemplary embodiment of the present invention. In the first exemplary embodiment, the one-shot trigger 145 generates the protection pulse signal PS3 according to the comparison voltage Vcomp, but in the third exemplary embodiment, the one-shot trigger 145' generates the protection pulse signal PS3' according to a negative voltage protection signal NPS.

Figure 6:
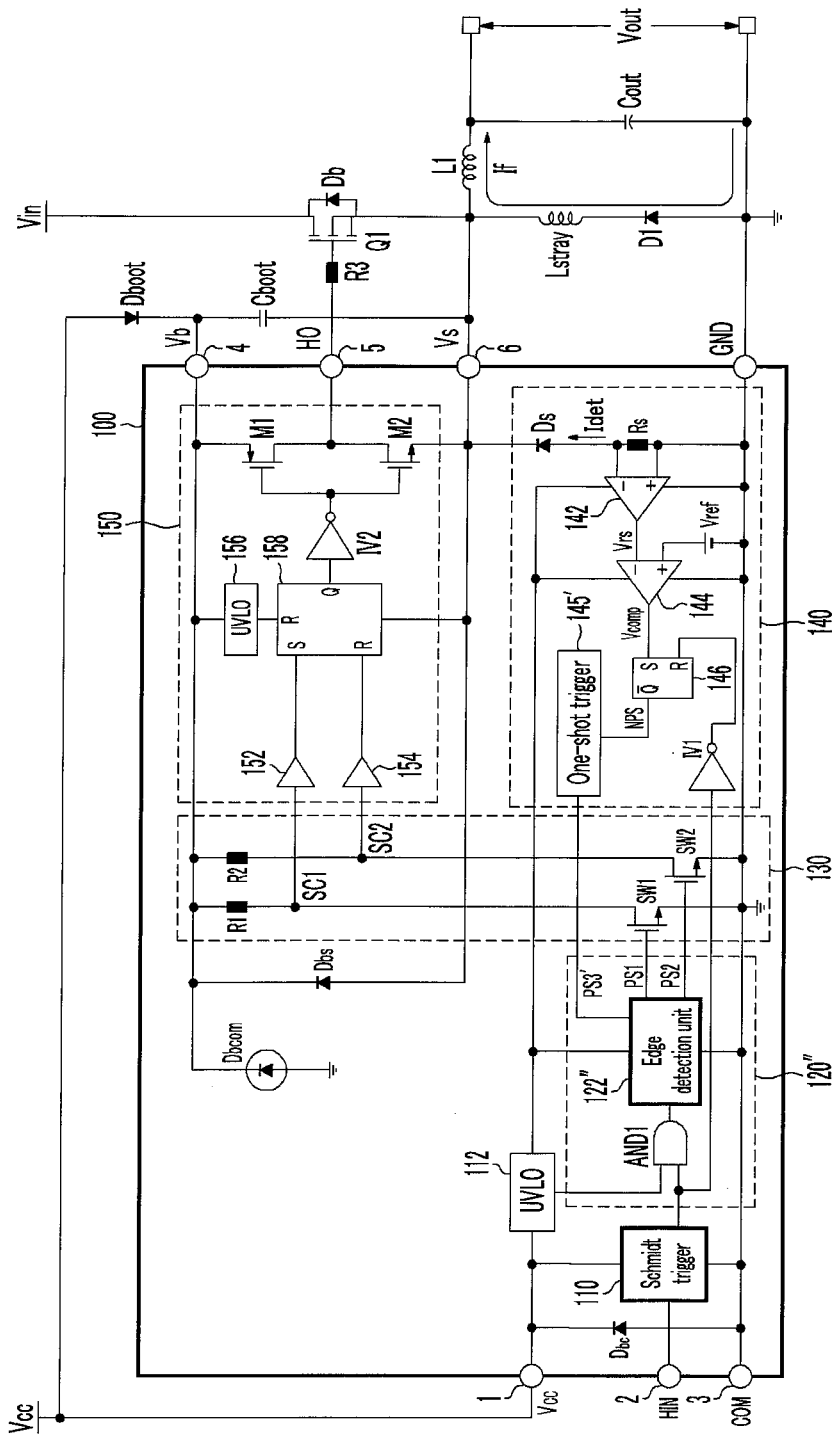
FIG. 6 shows a switch driving circuit according to a third exemplary embodiment of the present invention.

FIG. 6 shows a switch driving circuit according to the third exemplary embodiment of the present invention.

A protection unit 140" further includes a one-shot trigger 145' compared to the protection unit 140' of the second exemplary embodiment, and an edge detection unit 122' generates an OFF control signal PS2 according to a protection pulse signal PS3' output from the one-shot trigger 145'. In further detail, the edge detection unit 122" is synchronized at a rising time of the protection pulse signal PS3' and generates the OFF-pulse signal PS2.

In the exemplary embodiments of the present invention, the edge detection unit 122 detects the rising time of the negative voltage protection signal NPS or the protection pulse signals PS3 and PS3', but it may generate an OFF pulse signal PS2 by detecting a falling time of the negative voltage protection signal NPS or the protection pulse signals PS3 and PS3' when their waveforms are changed. That is, the edge detection unit 122 generates the OFF pulse signal PS2 according to one of a rising edge and a falling edge of the negative voltage protection signal NPS and the protection pulse signals PS3 and PS3' that are set according to design.

Figure 7:
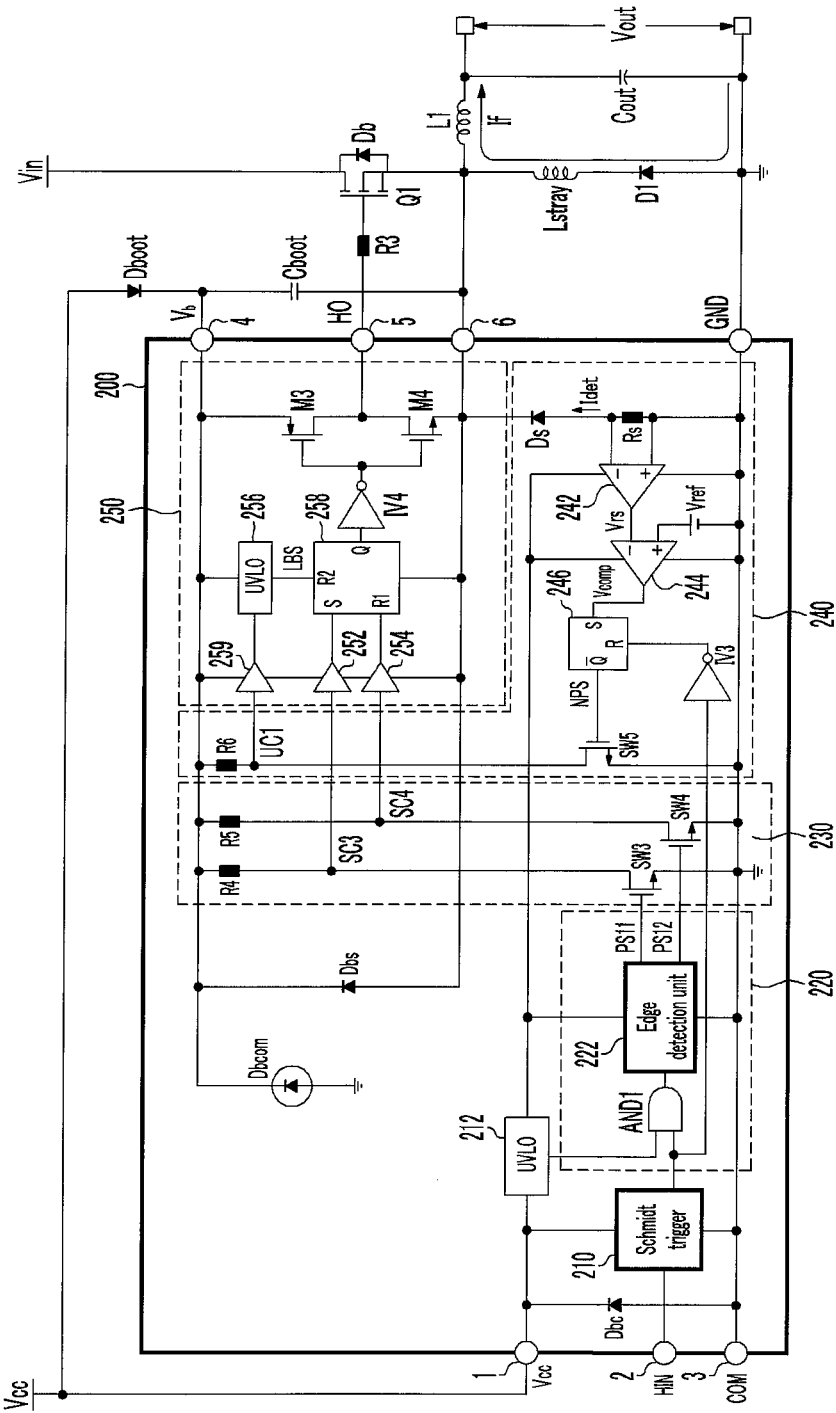
FIG. 7 shows a switch driving circuit according to a fourth exemplary embodiment of the present invention.

FIG. 7 shows a switch driving circuit according to a fourth exemplary embodiment of the present invention.

In the switch driving circuit of the fourth exemplary embodiment, the same components as those of the switch driving circuit according to the first exemplary embodiment are denoted by the same reference numerals. A power switch Q1, a bootstrap diode Dboot, a bootstrap capacitor Cboot, a resistor R3, a diode D1, an inductor L1, an output capacitor Cout, a parasitic inductor Lstray, and parasitic diodes Dbs, Dbcom, and Dbs of FIG. 7 are the same as those in FIG. 2. Thus, no further description will be provided.

Referring to FIG. 7, a switch driving circuit 200 according to the fourth exemplary embodiment of the present invention includes a Schmidt trigger 210, a UVLO 212, a pulse generator 220, a level shifter 230, a protection unit 240, and a gate signal generator 250.

The Schmidt trigger 210 outputs a high-level or low-level signal according to a switch driver control signal HIN.

The UVLO 212 outputs a low-level signal when a power voltage Vcc is lower than a predetermined threshold voltage, and outputs a high-level signal when the power voltage Vcc is higher than the predetermined threshold voltage.

The pulse generator 220 includes an AND gate AND2 and an edge detection unit 222. The AND gate AND2 receives the output signals of the Schmidt trigger 210 and the UVLO 212, performs an AND operation, and outputs the operation result. The edge detection unit 222 generates an ON-pulse signal PS11 at a rising time in which the output signal of the AND gate AND2 increases to high level from low level, and generates an OFF-pulse signal PS12 at a falling time in which the output signal AND gate AND2 decreases to the low level from the high level.

The level shifter 230 includes switches SW3 and SW4 and resistors R4 and R5. The switches SW3 and SW4 are respectively turned on/off according to the ON-pulse signal PS11 and the OFF-pulse signal PS12. The switches SW3 and SW4 are respectively formed as N-type channel transistors. According to the turn-on/off of the switches SW3 and SW4, switching control signals SC3 and SC4 are transmitted to a set terminal S and a reset terminal R of a flip-flop 258 through drivers 252 and 254.

In an abnormal state, the protection unit 240 according to the fourth exemplary embodiment of the present invention transmits a driving control signal UC1 corresponding to a high-level negative voltage protection signal NPS to the gate signal generator 250. The driving control signal UC1 transmitted to the gate signal generator 250 is transmitted to the UVLO 256 through a driver 259.

The UVLO 256 outputs a low voltage barred signal LBS when a voltage at both ends of the bootstrap capacitor Cboot is lower than a predetermined threshold voltage, and outputs a low voltage barred signal LBS in high level when the voltage at both ends of the bootstrap capacitor Cboot is higher than the predetermined threshold voltage. The UVLO 256 generates a low voltage barred signal LBS according to the driving control signal UC1. In further detail, the driving control signal UC1 generated by the protection unit 240 in the abnormal state according to the fourth exemplary embodiment of the present invention is input, and the UVLO 256 generates the low-level low voltage barred signal LBS. Then a power switch Q1 is turned off.

The protection unit 240 includes a detection diode Ds, a detection resistor Rs, an amplifier 242, a comparator 244, a flip-flop 246, an inverter IV3, a switch SW5, and a resistor R6. A cathode of the detection diode Ds is connected to a connection terminal 6 and an anode thereof is connected to a first end of the detection resistor Rs. A second end of the detection resistor Rs is grounded.

The amplifier 242 outputs a sense voltage Vrs by amplifying a voltage at both ends of the detection resistor Rs. An inversion (−) terminal and a non-inversion (+) terminal of the amplifier 242 are respectively connected to the first end and the second end of the detection resistor Rs, and an output terminal thereof is connected to an inversion (−) terminal of the comparator 244. The comparator 244 compares the sense voltage Vrs and a reference voltage Vref and outputs the comparison result. The comparator 244 receives an amplification voltage Vamp through the inversion (−) terminal and the reference voltage Vref through the non-inversion (+) terminal. An output terminal of the comparator 244 is connected to a set terminal S of the flip-flop 246. The inverter IV3 inverts an output signal of the Schmidt trigger 210 and transmits the inverted signal to a reset terminal R of the flip-flop 246. The flip-flop 246 outputs a negative protection signal NPS through an output terminal $\overline{Q}$. The flip-flop 246 operates the same as the flip-flop 146.

The switch SW5 according to the fourth exemplary embodiment of the present invention is formed as an N-type channel transistor. A drain electrode of the switch SW5 is connected to a first end of the resistor R6 and a source electrode thereof is grounded. The switch SW5 receives the negative voltage protection signal NPS through a gate electrode. A second end of the resistor R6 is connected to a bootstrap voltage terminal 4. When the switch SW5 is turned on, a first-end voltage of the resistor R6 becomes a ground voltage so that the driving control signal UC1 becomes the ground voltage. When the switch SW5 is turned off, the first-end voltage of the resistor R6 becomes a voltage obtained by dividing a bootstrap voltage Vb according to a turn-off resistance ratio of the resistor R6 and the switch SW5. The divided voltage is a predetermined high level signal such that the driving control signal UC1 becomes high level.

The gate signal generator 250 includes the three drivers 252, 254, and 259, the UVLO 256, a flip-flop 258, an inverter IV4, an ON driving switch M3, and an OFF driving switch M4. The driver 252 transmits a switching control signal SC3 to a set terminal S of the flip-flop 258, and the driver 254 transmits a switching control signal SC4 to a reset terminal R1 of the flip-flop 258. The flip-flop 258 operates the same as the flip-flop 158.

When the driving control signal UC1 is high level, the UVLO 256 according to the fourth exemplary embodiment of the present invention generates a low-level low voltage barred signal LBS irrespective of a voltage at both ends of the bootstrap capacitor Cboot. An output signal of the driver 252 is input to the set terminal S of the flip-flop 258, an output signal of the driver 254 is input to the reset terminal R1, and the low voltage barred signal LBS is input to a reset terminal R2. The flip-flop 258 outputs a low-level output signal through an output terminal Q when a low-level low voltage barred signal LBS is input. That is, when the low voltage barred signal is low level, a low-level gate signal HO is output.

The inverter IV4 inverts the output signal of the flip-flop 258 and outputs the inverted signal. The ON driving switch M3 and the OFF driving switch M4 are respectively realized as a P-type channel transistor and an N-type channel transistor. The ON driving switch M3 receives a bootstrap voltage Vb through a source electrode, and the OFF driving switch M4 receives a source voltage Vs through a source electrode. The ON driving switch M3 and the OFF driving switch M4 receive the output signal of the inverter IV4 through a common gate electrode, and output a gate signal HO through a common drain electrode.

As described, in the fourth exemplary embodiment of the present invention, the UVLO 256 generates the low-level low voltage barred signal LBS by the negative voltage protection signal NPS in order to turn off the power switch Q1 in the abnormal state.

Figure 8:
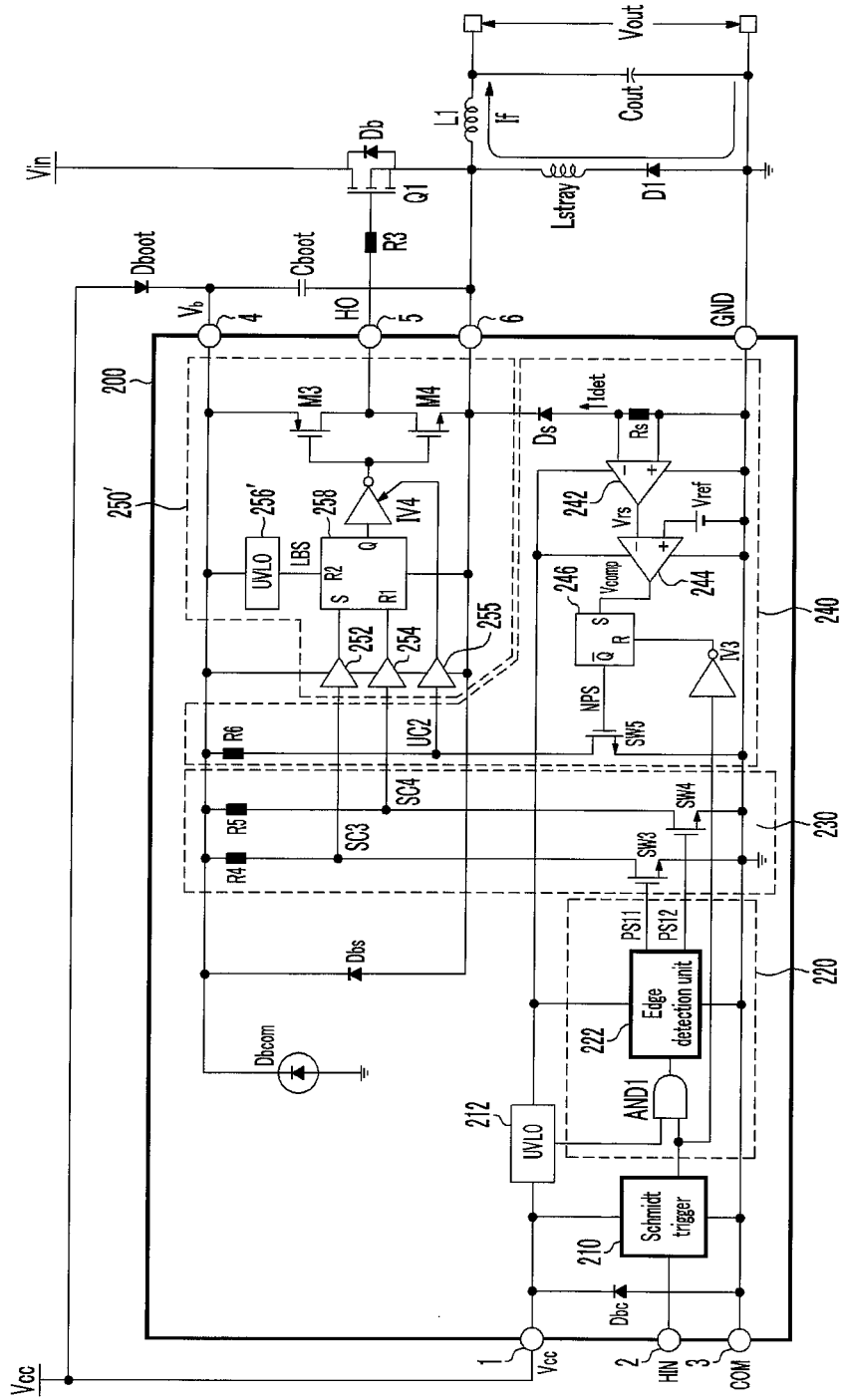
FIG. 8 shows a switch driving circuit according to a fifth exemplary embodiment of the present invention.

FIG. 8 shows a switch driving circuit according to a fifth exemplary embodiment of the present invention. Unlike the switch driving circuit of the fourth exemplary embodiment shown FIG. 7, an inverter IV4' is enabled or disabled by a driving control signal UC2.

In further detail, the inverter IV4' is enabled when a high-level driving control signal UC2 is transmitted from a driver 255, and thus inverts an input signal and outputs the inverted signal. When the driving control signal UC2 is low level, the inverter IV4' is disabled and thus outputs a high-level signal irrespective of the input signal.

When a negative voltage protection signal NPS becomes high level in an abnormal state, the driving control signal UC2 becomes low level by turn-on of a switch SW5, and the inverter IV4' outputs a high-level signal. A transistor M4 is turned on by the output signal of the inverter IV4' and thus a gate signal HO becomes low level and a power switch Q1 is turned off.

As described, in the fifth exemplary embodiment of the present invention, the inverter IV'4 is disabled by the negative voltage protection signal NPS to turn off the power switch Q1 in the abnormal state.

Figure 9:
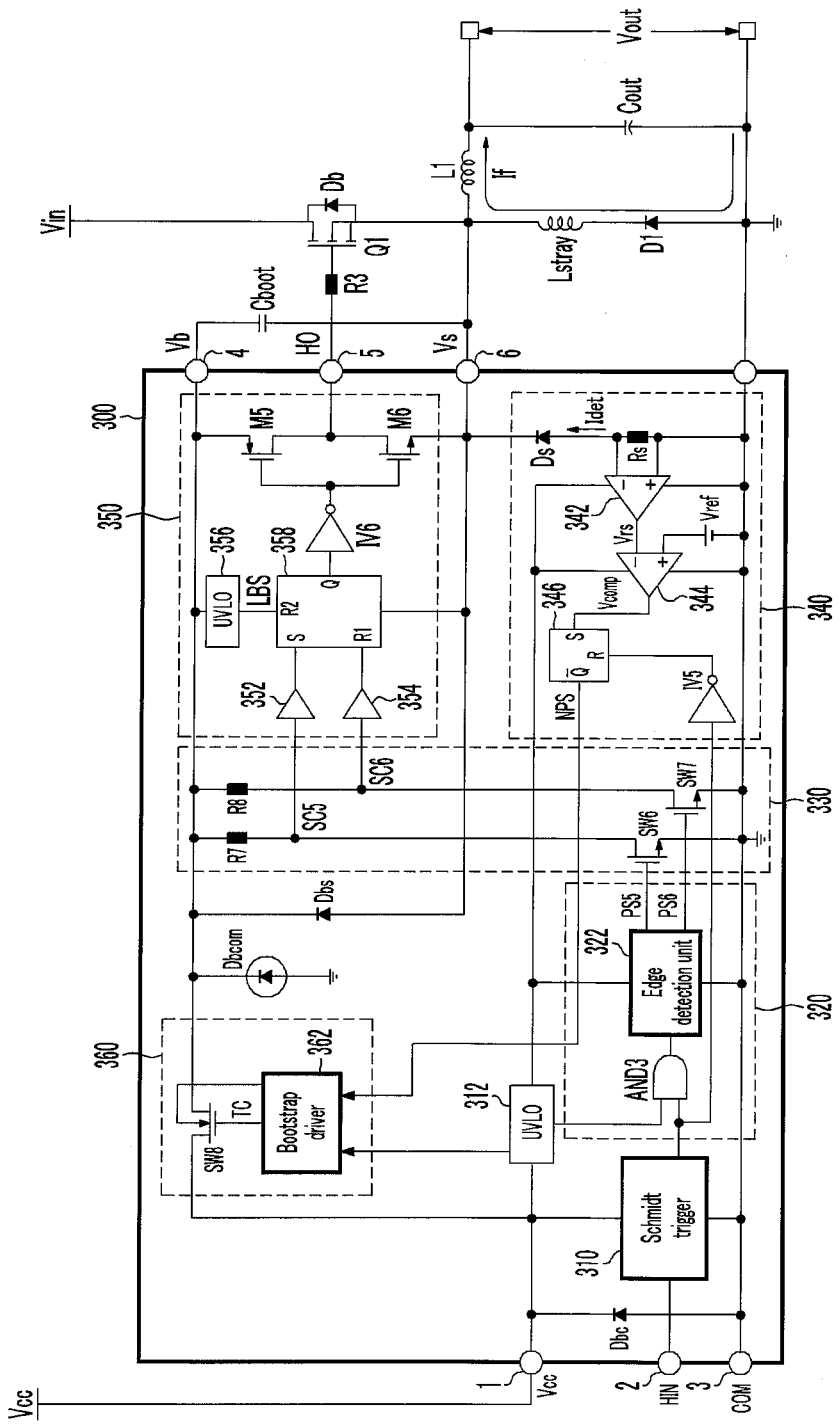
FIG. 9 shows a switch driving circuit according to a sixth exemplary embodiment of the present invention.

FIG. 9 shows a switch driving circuit according to a sixth exemplary embodiment of the present invention. Compared to the first to fifth exemplary embodiments of the present invention, the switch driving circuit according to the sixth exemplary embodiment of the present invention further includes a power voltage transmitting unit 360. In the abnormal state, the gate signal generator is controlled by generating the OFF pulse signal according to the first to third exemplary embodiments, and the power switch is turned off by directly controlling the gate signal generator according to the fourth and fifth exemplary embodiments. The switch driving circuit according to the sixth exemplary embodiment blocks power voltage supply to a gate signal generator in an abnormal state in order to stop operation of a power switch Q1.

A power switch Q1, a bootstrap capacitor Cboot, a resistor R3, a diode D1, an inductor L1, an output capacitor Cout, a parasitic inductor Lstray, and parasitic diodes Dbs, Dbcom, and Dbs shown in FIG. 9 are the same as those of the previous exemplary embodiment, and thus no further description will be provided.

Referring to FIG. 9, a switch driving circuit 300 according to the sixth exemplary embodiment of the present invention includes a Schmidt trigger 310, a UVLO 312, a pulse generator 320, a level shifter 330, a protection unit 340, a gate signal generator 350, and a power voltage transmitting unit 360.

Unlike the previous exemplary embodiment, the gate signal generator 350 according to the sixth exemplary embodiment of the present invention is supplied with a power voltage Vcc through the power voltage transmitting unit 360. In the previous exemplary embodiment, the power voltage Vcc was transmitted to the switch driving circuit through the bootstrap diode Dboot.

In further detail, the Schmidt trigger 310 outputs a high-level or low-level signal according to a switch driver control signal HIN.

The UVLO 312 outputs a low-level signal when the power voltage Vcc is lower than a predetermined threshold voltage, and outputs a high-level signal when the power voltage Vcc is higher than the predetermined threshold voltage.

The pulse generator 320 includes an AND gate AND3 and an edge detection unit 322. The AND gate AND3 receives the output signals of the Schmidt trigger 310 and the UVLO 312, performs an AND operation and outputs the operation result.

The edge detection unit 322 generates an ON-pulse signal PS5 at a rising time at which the output signal of the AND gate AND3 increases to high level from low level, and generates an OFF-pulse signal PS6 at a falling time at which the output signal AND gate AND3 decreases to the low level from the high level.

The level shifter 230 includes switches SW6 and SW7 and resistors R7 and R8. The switches SW6 and SW7 are respectively turned on/off according to the ON-pulse signal PS5 and the OFF-pulse signal PS6. The switches SW6 and SW7 are respectively formed as N-type channel transistors. According to the turn-on/off of the switches SW5 and SW6, switching control signals SC5 and SC6 are transmitted to a set terminal S and a reset terminal R of a flip-flop 358 through drivers 352 and 354.

In an abnormal state, the protection unit 340 transmits a high-level negative voltage protection signal NPS to the power voltage transmitting unit 360 so as to block a power voltage Vcc transmitted to the gate signal generator 350. Accordingly, operation of the gate signal generator 350 is stopped and the power switch Q1 maintains the turn-off state. FIG. 9 illustrates that the power voltage transmitting unit 360 blocks the power voltage Vcc by the negative voltage protection signal NPS, but the present invention is not limited thereto. As in the first exemplary embodiment, the power voltage transmitting unit 360 may block the power voltage Vcc according to the high-level protection pulse signal PS3 generated by the one-shot trigger 145.

The protection unit 340 includes a detection diode Ds, a detection resistor Rs, an amplifier 342, a comparator 344, a flip-flop 346, and an inverter IV5. A cathode of the detection diode Ds is connected to a connection terminal 6, and an anode thereof is connected to a first end of the detection resistor Rs. A second end of the detection resistor Rs is grounded. The amplifier 342 outputs a sense voltage Vrs by amplifying a voltage at both ends of the detection resistor Rs. An inversion (−) terminal and a non-inversion (+) terminal of the amplifier 342 are respectively connected to the first and second ends of the detection resistor Rs, and an output terminal of the amplifier is connected to an inversion (−) terminal of the comparator 344. The comparator 344 outputs a comparison voltage Vcomp by comparing a difference between the sense voltage Vrs and the reference voltage Vref. The comparator 344 receives the sense voltage Vrs through an inversion (−) terminal and the reference voltage Vref through a non-inversion (+) terminal. An output terminal of the comparator 344 is connected to a set terminal S of the flip-flop 346. The inverter IV5 inverts an output of the Schmidt trigger 310 and transmits the inversion result to a reset terminal R of the flip-flop 346. The flip-flop 346 outputs a negative voltage protection signal NPS through an output terminal $\overline{Q}$. The flip-flop 346 operates the same as the flip-flop 146 of the first exemplary embodiment.

The gate signal generator 350 includes drivers 352 and 354, a UVLO 356, a flip-flop 358, an inverter IV6, an ON driving switch M5, and an OFF driving switch M6. The driver 352 transmits a switching control signal SC5 to a set terminal S of the flip-flop 358, and the driver 354 transmits a switching control signal SC6 to a reset terminal R1 of the flip-flop 358.

The UVLO 356 outputs a low-level low voltage barred signal LBS when a voltage at both ends of the bootstrap capacitor C1 is lower than a predetermined threshold voltage, and outputs a high-level low voltage barred signal LBS when the voltage at both ends of the bootstrap capacitor C1 is higher than the predetermined threshold voltage. The low voltage barred signal LBS is transmitted to the reset terminal R1 of the flip-flop 358. The inverter IV6 inverts an output signal of the output terminal Q of the flip-flop 358 and outputs the inverted signal.

The ON driving switch M5 and the OFF driving switch M5 are respectively realized as a P-type channel transistor and an N-type channel transistor. The ON driving switch M5 receives a bootstrap voltage Vb through a source electrode, and the OFF driving switch M6 receives a source voltage Vs through a source electrode. The ON driving switch M5 and the OFF driving switch M6 respectively receive the output signal of the inverter IV6 through a common gate electrode and output a gate signal HO through a common drain electrode.

The power voltage transmitting unit 360 transmits a power voltage Vcc to a terminal of the bootstrap voltage Vb according to a negative voltage protection signal NPS. The power voltage transmitting unit 360 includes a bootstrap driver 362 and a bootstrap switch SW8. The bootstrap driver 362 generates a transmission control signal TC according to the output of the UVLO 322 and the output and negative voltage protection signal NPS, and transmits the transmission control signal TC to the bootstrap switch SW8. The bootstrap driver 362 outputs a low-level transmission control signal TC when the negative voltage protection signal NPS is high level, and outputs a high-level transmission control signal TC when the negative voltage protection signal NPS is low level.

The bootstrap switch SW8 is connected between a terminal of the power voltage Vcc and a terminal of the bootstrap voltage Vb, and is turned on/off according to the transmission control signal TC. In the sixth exemplary embodiment of the present invention, the bootstrap switch SW8 is an N-type channel transistor. However, the present invention is not limited thereto. That is, when the bootstrap switch SW8 is a P-type channel transistor, the transmission control signal TC becomes high level according to a high-level negative voltage protection signal NPS or becomes low level according to a low-level negative voltage protection signal NPS.

According to the present invention, an abnormal state is determined by using the source voltage Vs. That is, at least one of the protection pulse signal PS3 and the negative voltage protection signal NPS is generated by comparing the sense voltage Vrs generated from the source voltage Vs as a negative value with the reference voltage Vref. However, the present invention is not limited thereto. That is, a signal may be generated according to a level of the bootstrap voltage Vb rather than the source voltage Vs, and when the generated signal is in a level indicating that the bootstrap voltage Vb is a negative voltage, the abnormal state of the switch driving circuit is sensed and thus the switching operation of the power switch may be blocked or the operation of the gate signal generator may be stopped.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A switch driving circuit that receives a power voltage and a switch driving control signal and controls a switching operation of a power switch, comprising:
    a gate signal generator receiving a first voltage and a second voltage, operating by a voltage difference between the first and second voltages, and controlling a switching operation of the power switch according to the switch driving control signal; and
    a protection unit generating a sense voltage corresponding to the second voltage, comparing a predetermined reference voltage with the sense voltage to generate a comparison result, and controlling the gate signal generator to stop the switching operation of the power switch when the comparison result indicates that the first voltage has become negative.

2. The switch driving circuit of claim 1, further comprising a bootstrap capacitor having a first end connected to an output terminal of the power switch and a second end to which the power voltage is supplied,
    wherein the second voltage is a voltage at the first end of the bootstrap capacitor and the first voltage is a voltage at the second end of the bootstrap capacitor.

3. The switch driving circuit of claim 2, wherein, when the power switch is turned off, the protection unit generates a sense voltage that is proportional to an absolute value of the second voltage, compares the reference voltage with the sense voltage, and stops the switching operation of the power switch when the sense voltage is higher than the reference voltage.

4. The switch driving circuit of claim 3, wherein, the second voltage becomes a negative voltage when the power switch is turned off, and thus the protection unit generates the sense voltage by amplifying a voltage that is proportional to a sense current flowing to the output terminal of the power switch from a ground, and the reference voltage is set according to a sense voltage corresponding to the second voltage when the second voltage becomes a negative voltage and the first voltage also becomes a negative voltage.

5. The switch driving circuit of claim 3, wherein the protection unit comprises:
    a detection diode having a cathode connected to the output terminal of the power switch;
    a detection resistor having a first end connected to an anode of the detection diode and a second end connected to ground;
    an amplifier generating a sense voltage by amplifying a voltage at both ends of the detection resistor;
    a comparator comparing the sense voltage and the reference voltage; and
    a one-shot trigger generating a protection pulse signal when the sense voltage is higher than the reference voltage.

6. The switch driving circuit of claim 5, further comprising:
    a Schmidt trigger controlling a level of an output signal by comparing the switch driver control signal, a predetermined high-level reference voltage, and a low-level reference voltage;
    a pulse generator generating an ON pulse signal that turns on the power switch and an OFF pulse signal that turns off the power switch according to the output of the Schmidt trigger, and generating the OFF pulse signal according to the protection pulse signal; and a level shifter generating a first switching control signal according to the ON pulse signal, and generating a second switching control signal according to the OFF pulse signal, wherein the gate signal generator turns on the power switch according to the first switching control signal and turns off the power switch according to the second switching control signal.

7. The switch driving circuit of claim 3, wherein the protection unit comprises:
a detection diode having a cathode connected to the output terminal of the power switch;
a detection resistor having a first end connected to an anode of the detection diode and a second end connected to ground;
an amplifier generating a sense voltage by amplifying a voltage at both ends of the detection resistor;
a comparator comparing the sense voltage and the reference voltage; and
a flip-flop generating a negative voltage protection signal when the sense voltage is higher than the reference voltage.

8. The switch driving circuit of claim 7, further comprising:
a Schmidt trigger controlling a level of an output signal by comparing the switch driver control signal, a predetermined high-level reference voltage, and a low-level reference voltage;
a pulse generator generating an ON pulse signal that turns on the power switch and an OFF pulse signal that turns off the power switch according to the output of the Schmidt trigger, and generating the OFF pulse signal according to the negative voltage protection signal; and
a level shifter generating a first switching control signal according to the ON pulse signal and generating a second switching control signal according to the OFF pulse signal,
wherein the gate signal generator turns on the power switch according to the first switching control signal and turns off the power switch according to the second switching control signal.

9. The switch driving circuit of claim 7, wherein the protection unit further comprises a one-shot trigger that generates a protection pulse signal that is generated by being synchronized with the negative voltage protection signal and transmits the protection pulse signal to the pulse generator, and the protection pulse signal includes a predetermined-level pulse during a period that can be recognized by the pulse generator.

10. The switch driving circuit of claim 3, wherein the gate signal generator comprises:
a UVLO generating a low voltage barred signal to stop the switching operation of the power switch when a voltage difference between the first and second voltages is lower than a predetermined threshold voltage, and generates the low voltage barred signal according to a driving control signal to stop the switching operation of the power switch when the sense voltage is higher than the reference voltage; and
a first flip-flop turning of the power switch according to the low voltage barred signal.

11. The switch driving circuit of claim 10, wherein the protection unit comprises:
a detection diode including a cathode connected to an output terminal of the switch;
a detection resistor including a first end connected to an anode of the detection diode and a second end connected to ground;
an amplifier generating a sense voltage by amplifying a voltage at both ends of the detection resistor;
a comparator comparing the sense voltage and the reference voltage;
a second flip-flop generating the negative voltage protection signal when the sense voltage is higher than the reference voltage;
a resistor including a first end connected to the second end of the bootstrap capacitor; and
a switch including a first electrode connected to a second end of the resistor, a second electrode connected to the ground, and a gate electrode receiving the negative voltage protection signal,
wherein the driving control signal is a voltage of the first electrode of the switch.

12. The switch driving circuit of claim 3, further comprising a power voltage transmitting unit that blocks the power voltage transmitted to the gate signal generator when the sense voltage is higher than the reference voltage.

13. The switch driving circuit of claim 12, wherein the protection unit comprises:
a detection diode including a cathode connected to the output terminal of the power switch;
a detection resistor including a first end connected to the anode of the detection diode and a second end connected to ground;
an amplifier generating a sense voltage by amplifying a voltage at both ends of the detection resistor;
a comparator comparing the sense voltage and the reference voltage; and
a flip-flop generating a negative voltage protection signal when the sense voltage is higher than the reference voltage.

14. The switch driving circuit of claim 13, wherein the power voltage transmitting unit comprises:
a bootstrap switch transmitting the power voltage to the second end of the bootstrap capacitor; and
a bootstrap driver turning off the bootstrap switch according to the negative voltage protection signal.

15. The switch driving circuit of claim 3, wherein the gate signal generator comprises:
an inverter that is enabled or disabled according to the comparison result of the protection unit;
a first transistor that is turned on according to an output of the inverter; and a second transistor that is turned on according to the output of the inverter, having a first end connected to a first end of the first transistor, and being different from the first transistor in type,
wherein the gate signal is determined according to a voltage at the first end of the first transistor and a voltage at the first end of the second transistor.

16. A driving method of a switch driving circuit that receives a first voltage, a second voltage, and a switch driving control signal, operates by a voltage difference between the first and second voltages, and controls a switching operation of a power switch according to the switch driving control signal, comprising:
generating a sense voltage corresponding to the second voltage;
comparing a predetermined reference voltage with the sense voltage to generate a comparison result; and
stopping the switching operation of the power switch when the comparison result indicates that the first voltage has become negative.

17. The driving method of claim 16, wherein the generating the sense voltage generates the sense voltage with a value that is proportional to an absolute value of the second voltage when the power switch is in the turn-off state.

18. The driving method of claim 17, wherein the stopping the switching operation of the power switch comprises stopping the switching operation when the sense voltage is higher than the reference voltage.

19. The driving method of claim 16, further comprising:
generating an ON pulse signal turning on the power switch and an OFF pulse signal turning off the power switch according to the switch driver control signal;
generating a first switching control signal according to the ON pulse signal;
generating a second switching control signal according to the OFF pulse signal;
turning on the power switch according to the first switching control signal; and
turning off the power switch according to the second switching control signal.

20. The driving method of claim 19, wherein the stopping the switching operation of the power switch comprises generating the OFF pulse signal when the sense voltage is higher than the reference voltage.

21. The driving method of claim 16, further comprising a low voltage barred signal to stop the switching operation of the power switch when a voltage difference between the first and second voltages is lower than a predetermined threshold voltage,
wherein the stopping the switching operation of the power switch comprises the low voltage barred signal when the sense voltage is higher than the reference voltage.

22. The driving method of claim 16, wherein the stopping the switching operation of the power switch comprises blocking supply of the first voltage to the switch driving circuit when the sense voltage is higher than the reference voltage.

* * * * *